(12) United States Patent
Inoh et al.

(10) Patent No.: US 7,238,988 B2
(45) Date of Patent: Jul. 3, 2007

(54) SEMICONDUCTOR MEMORY DEVICE

(75) Inventors: Kazumi Inoh, Yokohama (JP); Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 11/000,045

(22) Filed: Dec. 1, 2004

(65) Prior Publication Data

US 2005/0285209 A1 Dec. 29, 2005

(30) Foreign Application Priority Data

Jun. 23, 2004 (JP) ............................. 2004-185333

(51) Int. Cl.
*H01L 27/01* (2006.01)
(52) U.S. Cl. ..................... 257/347; 257/349; 438/151
(58) Field of Classification Search ........ 257/347–351; 438/151, 581
See application file for complete search history.

(56) References Cited

U.S. PATENT DOCUMENTS

| 6,429,079 | B1 * | 8/2002 | Maeda et al. | ............... 438/281 |
|---|---|---|---|---|
| 6,576,956 | B2 * | 6/2003 | Kawanaka | .................. 257/347 |
| 6,621,725 | B2 | 9/2003 | Ohsawa | |
| 6,844,223 | B2 * | 1/2005 | Ko et al. | .................... 438/152 |
| 2005/0285209 | A1 | 12/2005 | Inoh et al. | |

FOREIGN PATENT DOCUMENTS

JP          2003-68877          3/2003

OTHER PUBLICATIONS

U.S. Appl. No. 11/304,681, filed Dec. 16, 2005, Hamamoto.
Takashi Ohsawa, et al. "Memory Design Using One-Transistor Gain Cell on SOI", ISSCC Digest of Technical Papers, Feb. 2002, pp. 152-154.

* cited by examiner

*Primary Examiner*—Sara Crane
(74) *Attorney, Agent, or Firm*—Oblon, Spivak, McClelland, Maier & Neustadt, P.C.

(57) ABSTRACT

A silicide film is provided in diffusion regions formed in a semiconductor layer. The silicide film has a thickness substantially same as that of the semiconductor layer. The silicide film has the bottom located in the vicinity of an interface between the insulator film and the semiconductor layer.

14 Claims, 8 Drawing Sheets

SEMICONDUCTOR MEMORY DEVICE

CROSS-REFERENCE TO PRIOR APPLICATION

This application is based upon and claims the benefit of priority from the prior Japanese Patent Application No. 2004-185333, filed on Jun. 23, 2004, the entire content of which is incorporated herein by reference.

BACKGROUND OF THE INVENTION

1. Field of the Invention

The present invention relates to a semiconductor memory device that stores data dynamically. More particularly, it relates to a semiconductor device, which includes a floating semiconductor layer (body region) in each memory cell electrically separated from other memory cells to store data depending on if the body region holds the majority carrier excessively therein.

2. Description of the Related Art

A DRAM is generally employed as a semiconductor memory device having a large storage capacity and tends to have an increasingly complicated structure because of progresses in fine pattering technologies. A new DRAM is proposed to achieve a relatively simpler structure but has a difficulty in its controllability. In either case, it is very hard to achieve high integration and high performance.

JP-A 2003-68877 proposes a semiconductor memory device capable of achieving high integration and high performance because of a simple structure. This semiconductor memory device comprises body regions formed on an SOI substrate, each electrically isolated from others. A threshold voltage is altered to store data depending on if the majority carrier is held excessively in the body region.

FIG. 16 shows a sectional structure of a unit memory cell in a DRAM, which is the semiconductor memory device disclosed in JP-A 2003-68877. FIG. 17 shows an equivalent circuit diagram thereof. The memory cell MC comprises an SOI-structured N-channel MOS transistor. Namely, it employs an SOI substrate, which includes a silicon substrate 10, a silicon oxide film 11 formed thereon as an insulator film, and a P-type silicon layer formed on the silicon oxide film 11. Ions of a P-type impurity are implanted into a region of the P-type silicon layer for memory cell formation to form a body region 12. A gate electrode 13 is then formed on a gate insulator 16 above the body region 12. N-type source/drain diffusion regions 14 and 15 are formed as self-aligned with the gate electrode 13. The source/drain diffusion regions 14 and 15 have an LDD structure that includes a low resistance layer 15A formed to a depth reaching the silicon oxide film 11 on the bottom and a high resistance layer 15B extending from the low resistance layer toward the gate electrode 13.

With respect to the body region 12 beneath the gate electrode 13, the oxide film may be employed for separation in the direction of the channel width (the direction perpendicular to the page of FIG. 16). In this case, the bottom and the sides in the direction of the channel width are isolated from others, and those in the direction of the channel length are separated at PN junctions. Thus, the body region 12 is kept in the floating state. Such memory cells MC are arrayed in matrix. In this case, the gate electrode 13 is connected to a word line WL, the source diffusion region 15 to a fixed potential line (ground potential line), and the drain diffusion region to a bit line BL.

FIG. 18 shows a layout of a memory cell array. FIGS. 19 and 20 show A-A' and B-B' sections of FIG. 18, respectively. The body regions 12 are device-isolated and patterned in grid by a buried silicon oxide film 21 (FIG. 20). The gate electrode 13 is formed continuously in one direction to provide the word line WL. The source diffusion region 15 is formed continuously along the word line WL to provide a fixed potential line (common source line). An interlayer insulator 23 covers the transistors and the bit line BL is formed on the insulator. The bit line BL is in contact with the drain diffusion region 14 shared by two transistors (memory cells), and is located as intersecting the word line WL.

This memory cell stores data through the use of storage of holes or the majority carrier in the body region 12. When the MOS transistor contained in the memory cell operates in the pentode region, a large current flows from the drain diffusion region 14 to cause impact ionization in the vicinity of the drain diffusion region 14. The impact ionization generates electron-hole pairs. The generated holes or majority carriers are held in the body region 12. This hole storage state (a higher potential state above a state of thermal equilibrium) may be defined as data "1", for example. A PN junction between the drain diffusion region 14 and the body region 12 is forward biased to release holes from inside the body region 12 to the drain diffusion region 14. This state is defined as data "0".

Data "1" and "0" have a difference in potential on the body region 12 and are stored as a difference in threshold voltage of the MOS transistor. A threshold voltage Vth1 in the state of data "1" with an elevated potential on the body region 12 due to the storage of holes is lower than a threshold voltage Vth0 in the state of data "0". It is required to apply a negative bias voltage to the word line to retain the state of data "1" with the majority carrier or holes stored in the body region 12. This data retaining state can not be changed on reading until writing (erasing) of opposite data is executed. Different from a 1-transistor/1-capacitor DRAM that employs storage of charge in a capacitor, non-destructive reading can be performed.

Such the DRAM has a problem because holes stored in the body region in one memory cell may flow into the body region in an adjacent memory cell through a parasitic bipolar transistor to vary or destroy data in the adjacent memory cell possibly (disturbance by the parasitic bipolar transistor). This problem is described specifically. For example, as shown in FIG. 21, in a memory cell MCL data "1" is stored because holes are held excessively in the body region 12. In contrast, in a memory cell MCR adjoining to and sharing the bit line BL with the memory cell MCL, data "0" is stored because holes are not held in the body region 12.

When the memory cell MCL is rewritten from "1" to "0" in this state, the voltage on the bit line BL shared by the memory cells MCR and MCL is changed from "H" to "L". As a result, holes in the body region 12 (p-type) of the memory cell MCL are injected therefrom into the drain diffusion region 14 (n-type) connected to the bit line BL. The injected holes disappear when they recombine with electrons or the majority carrier in the n-type drain diffusion region 14. In this case, because of a long diffusion length of the hole, part of the holes may possibly flow into the body region 12 (p-type) in the adjacent memory cell MCR and destroy "0" data in the memory cell MCR. This phenomenon can not be ignored because the drain diffusion region 14 tends to have a shortened length as fine patterning of the device proceeds.

SUMMARY OF THE INVENTION

The present invention provides a semiconductor memory device, which comprises an SOI substrate including a semiconductor layer of a first conduction type formed on an insulator film; and a plurality of memory cells each formed on the SOI substrate as a transistor. The transistor includes diffusion layers of a second conduction type formed with the bottoms reaching the insulator film, a gate electrode formed on a gate insulator above the semiconductor layer as sandwiched between the diffusion layers, and a body region formed as a region of the semiconductor layer surrounded by the diffusion layers, the gate electrode and the insulator film and electrically separated from others to store data depending on a charge storage state. The semiconductor memory device further comprises a silicide film formed in the diffusion regions. The silicide film has a thickness substantially same as that of the semiconductor layer. The silicide film has the bottom located in the vicinity of an interface between the insulator film and the semiconductor layer.

The present invention provides a method of manufacturing a semiconductor memory device. The method comprises a body region formation step of forming a body region of a first conduction type composed of impurity-doped silicon on an insulator film in each memory cell as electrically separated from others; a gate electrode formation step of forming a gate electrode on a gate insulator above the body region; a diffusion region formation step of implanting an impurity into the body region at both sides of the gate electrode to form diffusion regions of a second conduction type with the bottoms reaching the surface of the insulator film; a metal film formation step of forming a metal film on surfaces of the diffusion regions; a silicide layer formation step of heating the metal film for reaction with silicon in the diffusion region to form a silicide layer thickened to have the bottom reaching in the vicinity of the insulator film; and a wire layer formation step of forming a wire layer connected to the silicide layer.

DETAILED DESCRIPTION OF THE INVENTION

The embodiments of the present invention will now be described with reference to the drawings.

Figure 1:
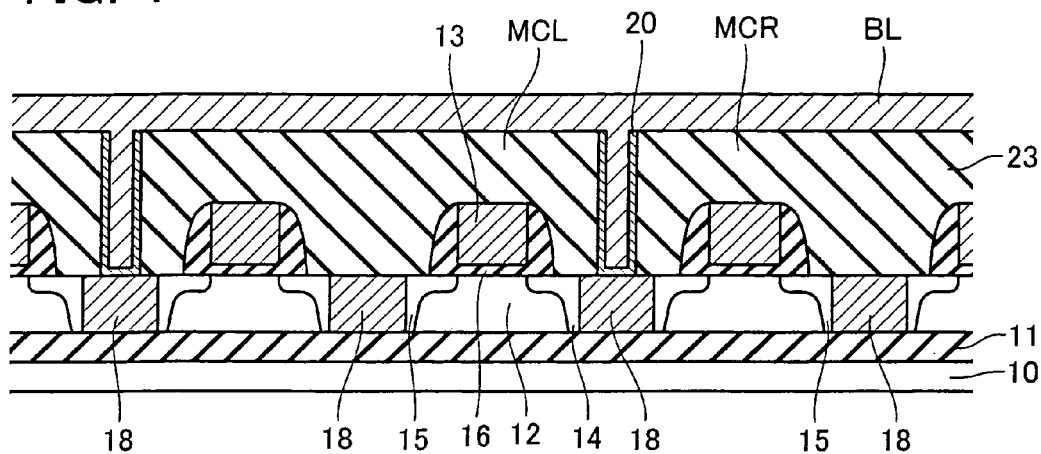
FIG. 1 shows a cross-sectional view of a memory cell array of a DRAM in a first embodiment of the present invention.
Figure 18:
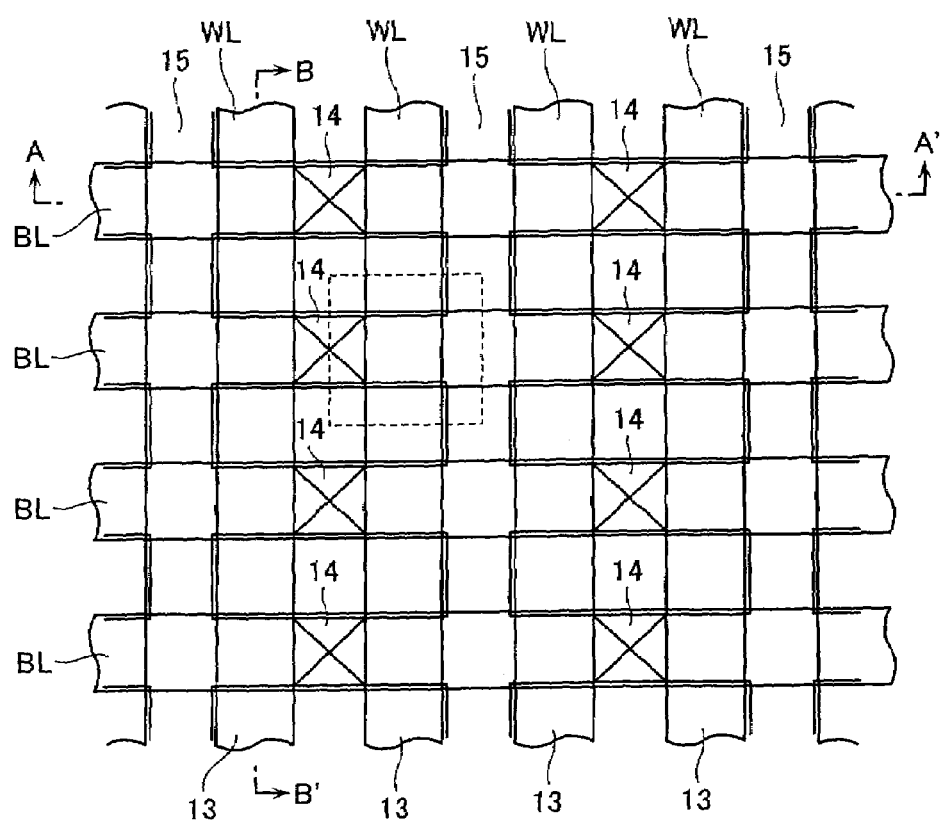
FIG. 18 shows a layout of a memory cell array of the DRAM according to the prior art.
Figure 19:
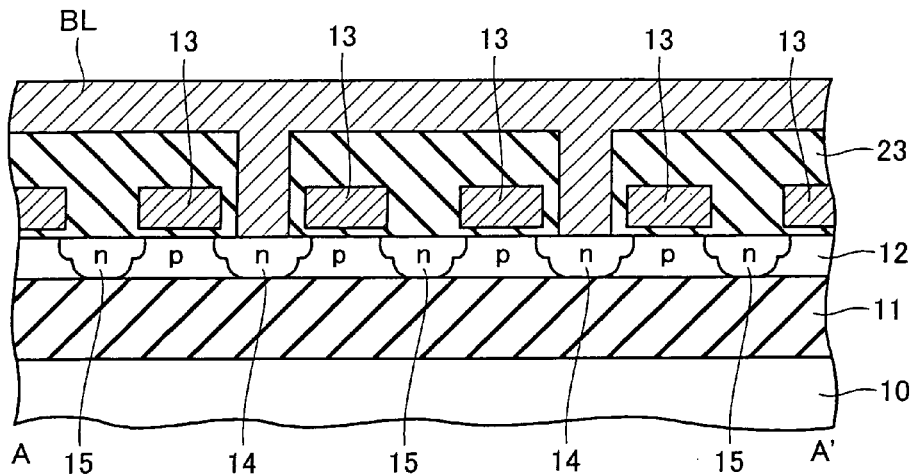
FIG. 19 shows an A-A' cross-sectional view of FIG. 18.

FIG. 1 shows a structure of a DRAM according to a first embodiment of the invention. This DRAM is structured to have the same wiring layout as FIG. 18 and the same B-B' cross-sectional view as FIG. 20. FIG. 1 shows the memory cell array of the DRAM in this embodiment as the A-A' cross-sectional view of FIG. 18. The parts given the same reference numerals are similar to those of the prior art shown in FIGS. 16-20 and their detailed descriptions are omitted.

Figure 21:
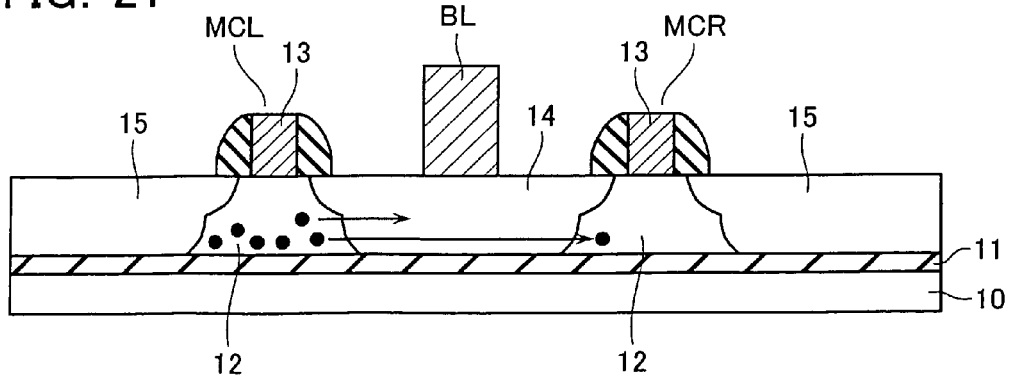
FIG. 21 illustrates a problem associated with the prior art.

In the first embodiment, a silicide layer 18 is buried in the drain diffusion region 14 and the source diffusion region 15 located between a pair of memory cells MCL and MCR. The silicide layer 18 serves to reduce a contact resistance between the drain diffusion region 14 and a bit line BL shared by the pair of memory cells MCL and MCR. The silicide layer 18 has the same thickness as that of the drain diffusion region 14. The silicide layer 18 has the bottom coincident with an interface between a body region layer 12 (or the drain diffusion region 14) and an insulator film 11. As described in FIG. 21, excessive holes are similarly held in the body region 12 of the memory cell MCL in FIG. 1 to store-data "1", and holes are not held in the body region 12 of the adjacent memory cell MCR to store data "0". In this assumed state, for rewriting the memory cell MCL to "0", the voltage on the bit line BL is changed from "H" to "L" to inject the holes from inside the body region 12 of the memory cell MCL into the drain diffusion region 14. In this case, the injected holes disappear when they recombine with electrons at an interface between the silicide layer 18 and the drain diffusion region 14, remaining no holes that can reach the body region 12 of the adjacent memory cell MCR. Therefore, data "0" in the memory cell MCR cannot be destroyed. The silicide layer 18 invites no upsizing of device regions because it can be formed finely through the process steps described below.

The process steps of manufacturing the memory cell array shown in FIG. 1 are described with reference to FIGS. 2-8.

Figure 2:
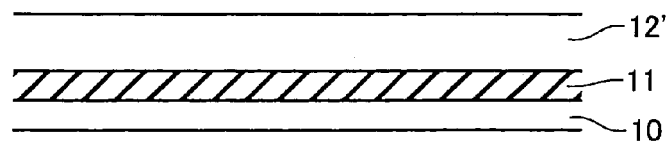
FIG. 2 shows a process step of manufacturing the memory cell array in the first embodiment.

First, as shown in FIG. 2, the silicon oxide film 11 and a P-type active layer 12' are deposited in turn on the silicon substrate 10. The P-type active layer 12' has an impurity concentration as low as about 1e+14 [$cm^{-3}$]. The P-type active layer 12' is then separated into regions each for forming a pair of memory cells MC (memory cell formation regions) using a device isolation film (corresponding to the silicon oxide film 21 in FIG. 20 but not shown in FIG. 2).

Ions of a P-type impurity are implanted into the separated memory cell formation regions to form the body regions 12.

Figure 3:
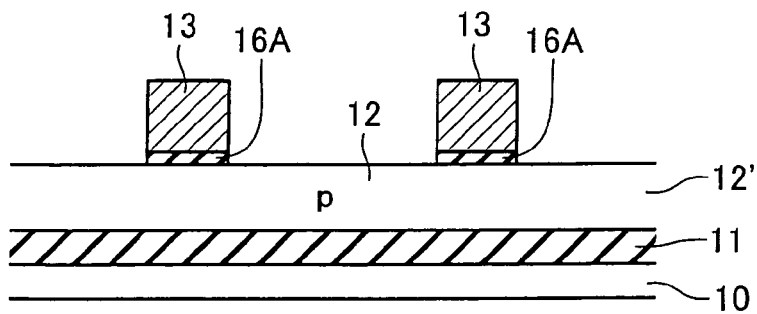
FIG. 3 shows a process step of manufacturing the memory cell array in the first embodiment.

Next, as shown in FIG. 3, a gate insulator 16A of silicon oxide is deposited over the body regions 12 and, as the material of the gate electrode 13, a polysilicon film is further deposited with a thickness of about 150 nm over the gate insulator. Then, processes of patterning and reactive ion etching (RIE) are applied to form the gate electrode 13 as shown in FIG. 3.

Figure 4:
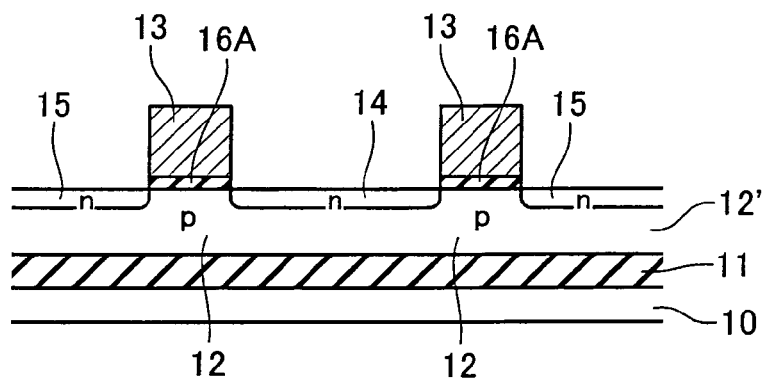
FIG. 4 shows a process step of manufacturing the memory cell array in the first embodiment.
Figure 5:
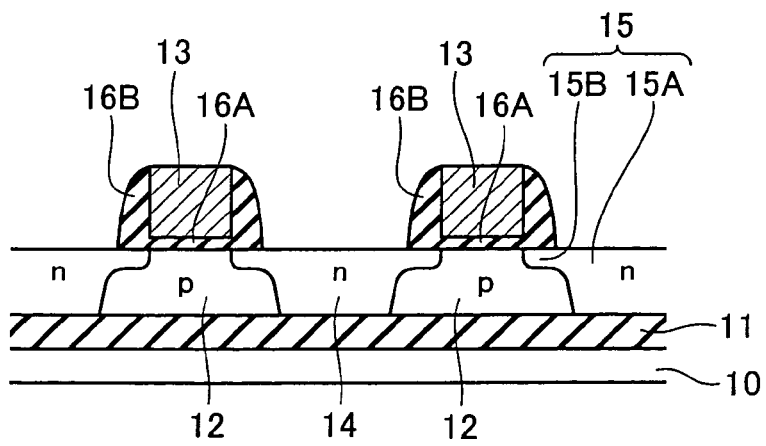
FIG. 5 shows a process step of manufacturing the memory cell array in the first embodiment.
Figure 20:
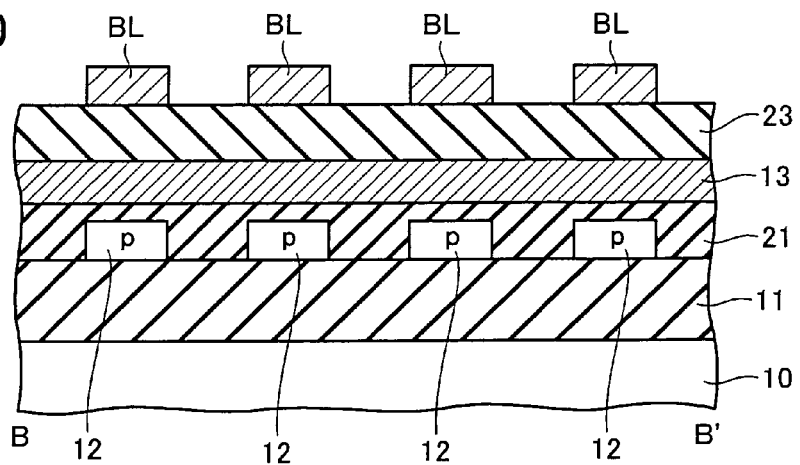
FIG. 20 shows a B-B' cross-sectional view of FIG. 18.

Then, as shown in FIG. 4, using a mask of the gate electrode 13, an N-type impurity is implanted into the body regions 12 to form the self-aligned drain/source diffusion regions 14 and 15. Further, as shown in FIG. 5, a silicon oxide sidewall 16B is formed around the gate electrode 13. The sidewall 16B can be formed through processes of depositing a CVD film over the substrate and RIE etching off undesired portions from the film. Subsequently, an N-type impurity is implanted again into the body regions 12 with a mask of the sidewall 16B and gate electrode 13. As a result, the drain diffusion region 14 and the source diffusion region 15 are formed in the so-called LDD structure as shown in FIG. 5. The LDD structure has the low resistance layer 15A with the bottom reaching the upper surface of the silicon oxide film 11 and the high resistance layer 15B extending from the low resistance layer toward the gate electrode. Thereafter, etching the body regions 12 and the drain diffusion regions 14 and forming the buried silicon oxide film 21 therein as shown in FIG. 20 are performed to pattern the body regions 12 in grid.

Figure 6:
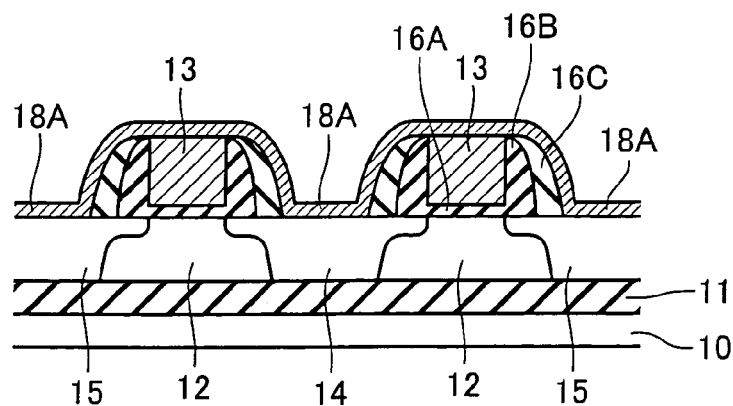
FIG. 6 shows a process step of manufacturing the memory cell array in the first embodiment.

Next, as shown in FIG. 6, an extra sidewall 16C of silicon oxide is formed on both sides of the sidewall 16B. A spattering process is applied to evaporate a metal film 18A composed of cobalt (Co) over the entire surface. Tungsten (W) or nickel(Ni) may also be employed instead of cobalt.

Figure 7:
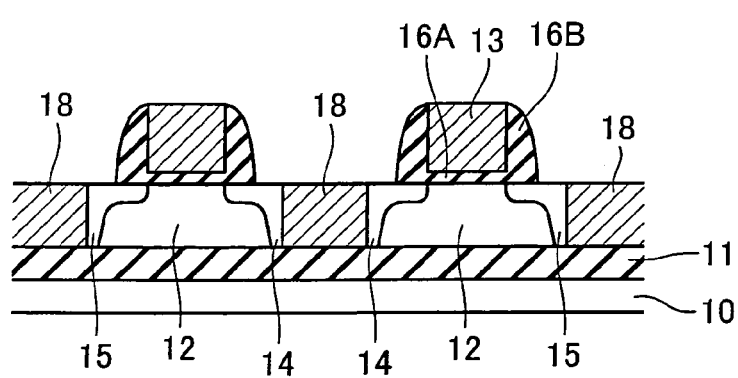
FIG. 7 shows a process step of manufacturing the memory cell array in the first embodiment.

Then, as shown in FIG. 7, through a certain thermal process, the metal film 18A reacts with silicon in the drain diffusion regions 14 to form the silicide film 18 thickened to reach the upper surface of the silicon oxide film 11.

Figure 8:
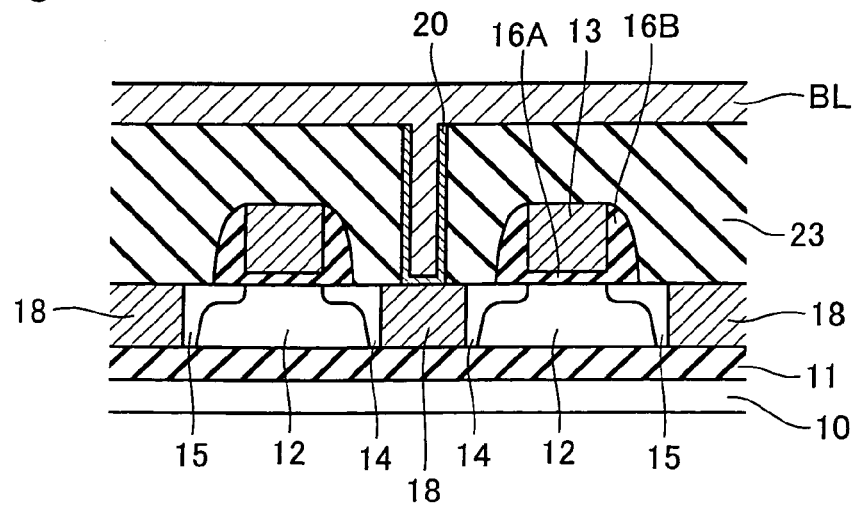
FIG. 8 shows a process step of manufacturing the memory cell array in the first embodiment.

After removing non-reacted portions from the metal film 18A and removing the extra sidewall 16C, as shown in FIG. 8, a process of low pressure CVD is employed to deposit the interlayer insulator 23 of silicon oxide over the entire surface. Subsequently, the interlayer insulator 23 is planarized to the extent that still prevents exposure of the gate electrode 13. Then, the silicon oxide film 23 on the drain diffusion region 14 is etched to form a contact hole therethrough. Next, spattering is applied to form a barrier metal film 20 composed of, for example, tungsten inside the contact hole, and the bit line BL is then formed to complete the memory cell array.

Figure 9:
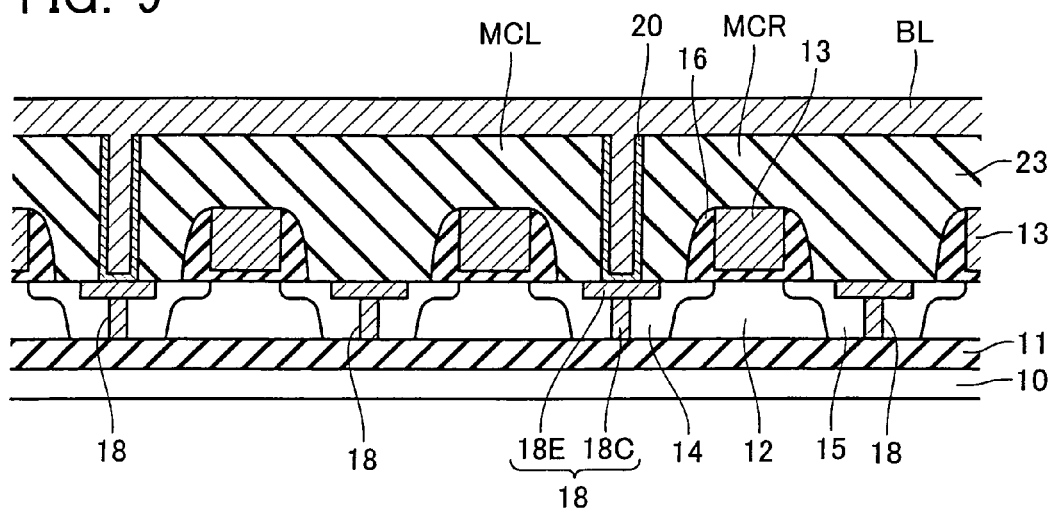
FIG. 9 shows a cross-sectional view of a memory cell array of a DRAM in a second embodiment of the present invention.

A cross-sectional view is described with reference to FIG. 9 for a memory cell array of a DRAM according to a second embodiment of the present invention. This embodiment differs from the first embodiment in shape of the silicide film 18 that is formed in the drain diffusion region 14 shared by the pair of memory cells MCL and MCR. In this embodiment the silicide film 18 has an upper layer portion 18E and a lower layer portion 18C as shown in FIG. 9. The upper layer portion 18E is formed widely along the surface of the drain diffusion region 14. The lower layer portion 18C is formed beneath the upper layer portion 18E in a narrower area than that of the upper layer portion 18E and has a lower end that reaches the silicon oxide film 11.

Generally, a silicide is excellent in intimate contact with silicon and not with a silicon oxide. In this embodiment, the lower layer portion 18C is designed to have a smaller lateral sectional area to reduce the area of a junction between the silicon oxide film 11 and the silicide layer 18. Even this design is sufficient to recombine holes injected from the body region 12 into the drain diffusion region 14. This structure is possible to provide a wider contact area and a lower contact resistance between the drain diffusion region 14 and the silicide layer 18 compared to the first embodiment.

Figure 10:
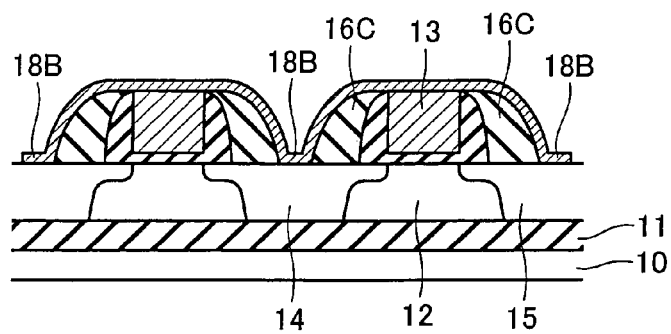
FIG. 10 shows a process step of manufacturing the memory cell array in the second embodiment.
Figure 11:
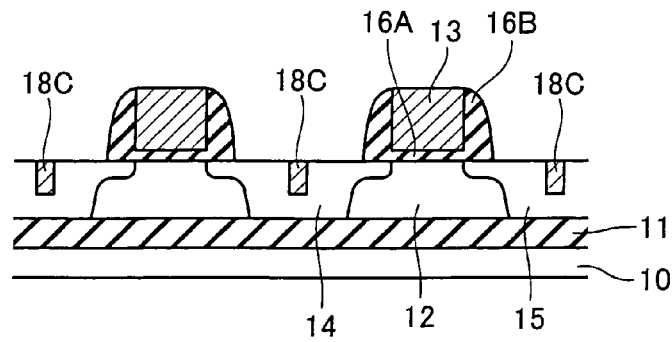
FIG. 11 shows a process step of manufacturing the memory cell array in the second embodiment.

The process steps of manufacturing the memory cell array in the second embodiment are described based on FIGS. 10-13. The steps shown in FIGS. 1-5 are executed first like in the first embodiment. Then, as shown in FIG. 10, the extra sidewall 16C is formed on the outside of the sidewall 16B and the metal film 18B of cobalt is evaporated by spattering. Subsequently, as shown in FIG. 11, the metal film 18B is subjected to a certain thermal process to form the silicide film 18C. In this case, the heating time of the thermal process is adjusted so that the silicide film 18C is thickened to terminate the bottom thereof at a middle layer in the drain diffusion region 15.

Figure 12:
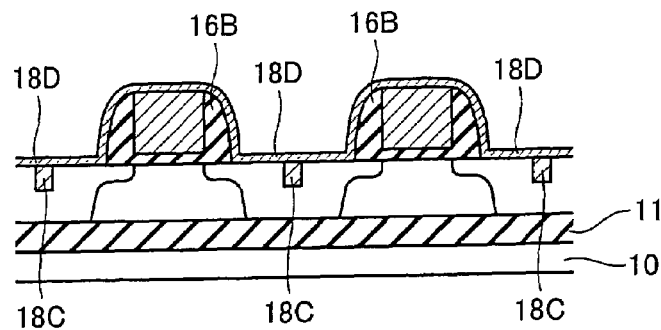
FIG. 12 shows a process step of manufacturing the memory cell array in the second embodiment.
Figure 13:
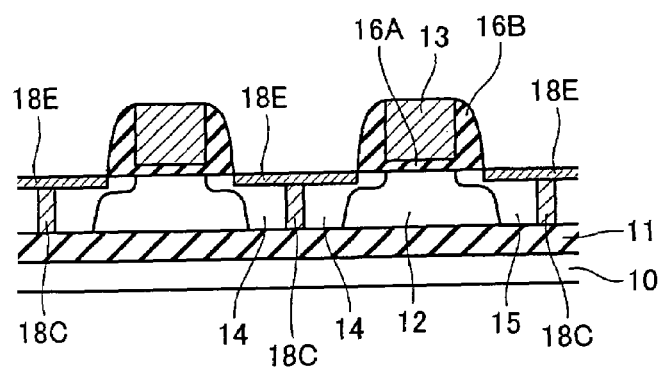
FIG. 13 shows a process step of manufacturing the memory cell array in the second embodiment.

Subsequently, as shown in FIG. 12, after removing the extra sidewall 16C, a metal film 18D of cobalt is evaporated by spattering. Then, as shown in FIG. 13, a certain thermal process is applied to the metal film 18D to form the silicide film 18E. The silicide film 18E is not in contact with the silicon oxide film 11 and is connected only to the silicon layer or the drain diffusion region 14, remaining no problem on adhesion.

As this thermal process further extends the silicide film 18C downward, the time of the thermal process is adjusted such that the bottom of the silicide layer 18C reaches the upper surface of the silicon oxide 11. Thereafter, as is described in the first embodiment with reference to FIGS. 8 and 9, the interlayer insulator 23 and the bit lines BL are formed to complete the memory cell-array.

Figure 14:
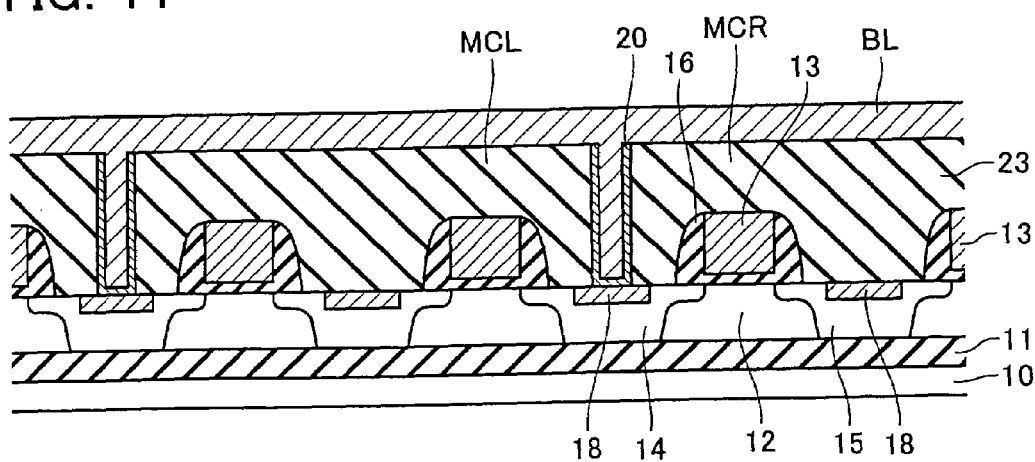
FIG. 14 shows a cross-sectional view of a memory cell array of a DRAM in a third embodiment of the present invention.

A cross-sectional view is described with reference to FIG. 14 for a memory cell array of a DRAM according to a third embodiment of the present invention. This embodiment differs from the first and second embodiments in shape of the silicide layer 18 that is formed in the drain diffusion region 14 shared by the pair of memory cells MCL and MCR. In this embodiment the silicide film 18 is composed of a layer widely formed along the surface of the drain diffusion region 14 as shown in FIG. 14.

If the drain diffusion region 14 has a thin thickness, the silicide layer 18 formed along the silicon surface can prevent holes in the body region 12 from flowing into a body region in an adjacent memory cell. If the drain diffusion region 14 has a thickness of 100 nm or below, or the silicide layer 18 and the silicon oxide film 11 have a distance of 80 nm or below therebetween, holes can be prevented from flowing into. More generally, the distance between the bottom of the silicide layer 18 and the silicon oxide film 11 may be designed equal to or less than ⅘ of the thickness of the drain diffusion region 14.

Figure 15:
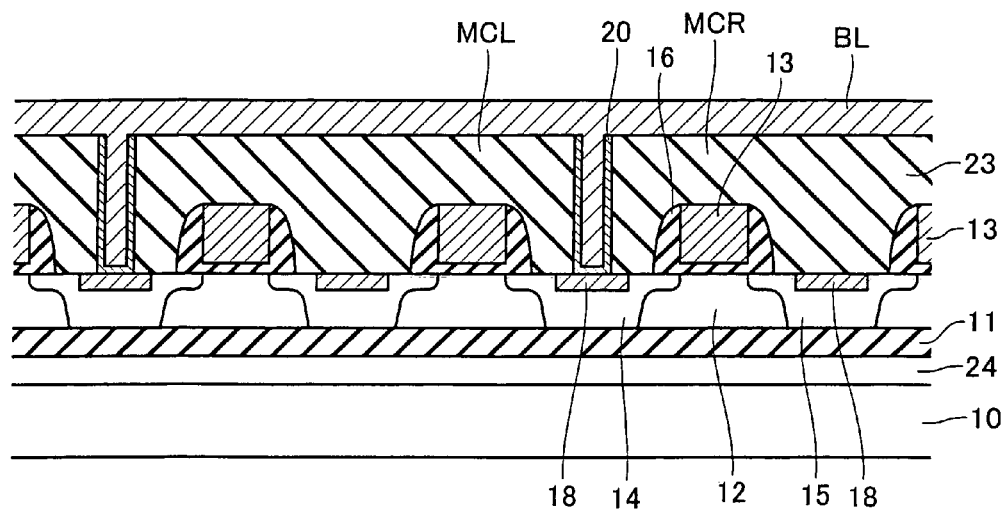
FIG. 15 shows a cross-sectional view of a memory cell array of a DRAM in a fourth embodiment of the present invention.
Figure 16:
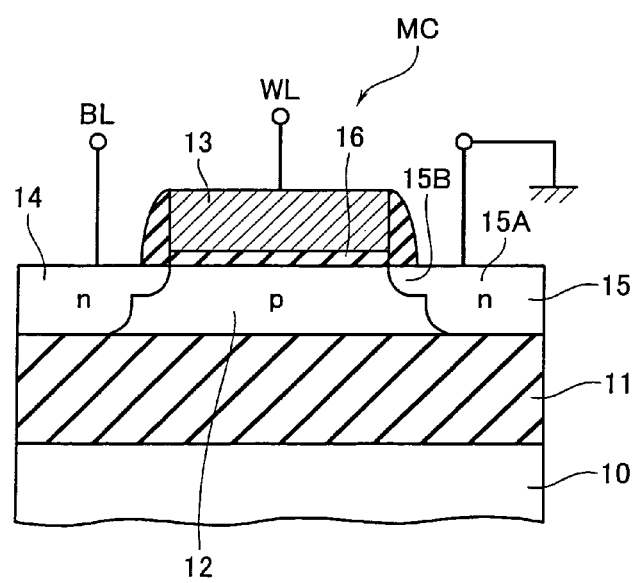
FIG. 16 shows a sectional structure of a unit memory cell in a DRAM according to the prior art.
Figure 17:
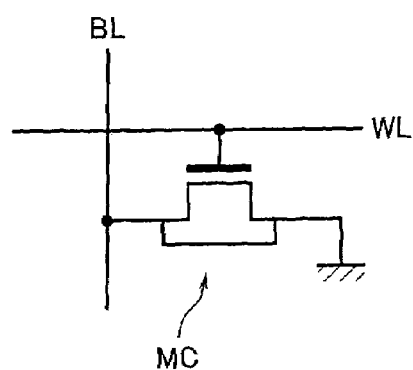
FIG. 17 shows an equivalent circuit of the memory cell in FIG. 16.

A cross-sectional view is described with reference to FIG. 15 for a memory cell array of a DRAM according to a fourth embodiment of the present invention. This embodiment differs from the first and second embodiments in shape of the silicide layer 18 that is formed in the drain diffusion region 14 shared by the pair of memory cells MCL and MCR. In this embodiment the silicide film 18 is composed of a layer widely formed along the surface of the drain diffusion region 14 as shown in FIG. 15. A diffusion layer is formed in the surface layer of the silicon substrate 10 to provide a plate electrode 24.

When a voltage is applied to the plate electrode 24, the potential on the drain diffusion region 14 can be controlled.

The silicide layer 18 formed along the silicon surface, together with the potential control by the plate electrode, can prevent holes in the body region 12 from flowing into a body region in an adjacent memory cell.

The embodiments of the invention have been described above while the present invention is not limited to these embodiments. Rather, various modifications, additions and replacements can be devised without departing from the spirit and scope of the invention.

What is claimed is:

1. A semiconductor memory device, comprising:
   an SOI substrate including a semiconductor layer of a first conduction type formed on an insulator film;
   a plurality of memory cells each formed on said SOI substrate as a transistor, said transistor including
   diffusion layers of a second conduction type formed with the bottoms reaching said insulator film,
   a gate electrode formed on a gate insulator above said semiconductor layer as sandwiched between said diffusion layers, and
   a body region formed as a region of said semiconductor layer surrounded by said diffusion layers, said gate electrode and said insulator film and electrically separated from others to store data depending on a charge storage state; and
   a silicide film formed in said diffusion regions, wherein said silicide film has a thickness substantially same as that of said semiconductor layer, and wherein said silicide film has the bottom located in the vicinity of an interface between said insulator film and said semiconductor layer.

2. The semiconductor memory device according to claim 1, wherein said silicide film has one portion with a thickness substantially same as that of said semiconductor layer and other portions formed thinner than said one portion in surfaces of said diffusion layers.

3. The semiconductor memory device according to claim 1, further comprising a wire layer, wherein said silicide film is electrically connected to said wire layer to apply a voltage given on said wire layer to said diffusion layers.

4. The semiconductor memory device according to claim 1, further comprising an interlayer insulator covering said gate electrode and said semiconductor layer,
   wherein said wire layer is electrically connected to said diffusion layers via a contact hole formed through said interlayer insulator.

5. The semiconductor memory device according to claim 4, wherein said wire layer is formed inside said contact hole via a baffler metal film formed in said contact hole.

6. The semiconductor memory device according to claim 1, wherein said silicide film is composed of a silicide of cobalt (Co).

7. The semiconductor memory device according to claim 1, wherein said diffusion layer has a low resistance region and a high resistance region, said low resistance region being formed with the bottom reaching said insulator film and having a first impurity concentration, said high resistance region extending from said low resistance region toward said gate electrode and having a second impurity concentration lower than said first impurity concentration.

8. The semiconductor memory device according to claim 1, wherein said silicide film is formed in said diffusion layer shared by a pair of memory cells.

9. A method of manufacturing a semiconductor memory device, comprising:
   a body region formation step of forming a body region of a first conduction type composed of impurity-doped silicon on an insulator film in each memory cell as electrically separated from others;
   a gate electrode formation step of forming a gate electrode on a gate insulator above said body region;
   a diffusion region formation step of implanting an impurity into said body region at both sides of said gate electrode to form diffusion regions of a second conduction type with the bottoms reaching the surface of said insulator film;
   a metal film formation step of forming a metal film over the entire surface;
   a silicide layer formation step of heating said metal film for reaction with silicon in said diffusion region to form a suicide layer thickened to have the bottom reaching in the vicinity of said insulator film; and
   a wire layer formation step of forming a wire layer connected to said silicide layer.

10. The method according to claim 9, wherein said metal film formation step and said suicide layer formation step include the steps of:
    forming a first metal film over the entire surface;
    heating said first metal film to form a first silicide layer;
    forming a second metal film over the entire surface; and
    heating said second metal film to form a second silicide layer which has wider area than that of said first silicide layer.

11. The method according to claim 9, wherein said suicide film is formed in said diffusion layer shared by a pair of memory cells.

12. The method according to claim 9, wherein said metal film is composed of cobalt (Co).

13. The method according to claim 9, further comprising the step of forming an interlayer insulator covering said gate electrode and said semiconductor layer, wherein said wire layer is formed as electrically connected to said diffusion layers via a contact hole after said contact hole is formed through said interlayer insulator.

14. The method according to claim 9, wherein said wire layer is formed inside said contact hole after a barrier metal film is formed in said contact hole.

* * * * *